United States Patent [19]

Hechtman

[11] Patent Number: 4,837,507
[45] Date of Patent: Jun. 6, 1989

[54] HIGH FREQUENCY IN-CIRCUIT TEST FIXTURE

[75] Inventor: Charles D. Hechtman, Plainsboro, N.J.

[73] Assignee: American Telephone and Telegraph Company AT&T Technologies, Inc., Berkeley Heights, N.J.

[21] Appl. No.: 112,337

[22] Filed: Oct. 26, 1987

Related U.S. Application Data

[63] Continuation of Ser. No. 749,138, Jun. 27, 1985, abandoned, Continuation-in-part of Ser. No. 618,804, Jun. 8, 1984, abandoned.

[51] Int. Cl.$^4$ .................... G01R 1/06; G01R 31/02
[52] U.S. Cl. .................... 324/158 P; 324/73 PC; 324/158 F
[58] Field of Search ............ 324/158 F, 158 P, 72.5, 324/73 PC

[56] References Cited

U.S. PATENT DOCUMENTS 3,330,982 7/1967 Dickson, Jr. .................... 324/158 P
3,731,191 5/1973 Bullard et al. .................... 324/158 P
4,164,704 8/1979 Kato et al. ....................... 324/73 PC
4,574,236 3/1986 Hechtman ........................ 324/158 F

FOREIGN PATENT DOCUMENTS 2051052 4/1972 Fed. Rep. of Germany .

OTHER PUBLICATIONS

Morton et al; "High-Performance AC Chip Contactor"; IBM Tech. Dis. Bull.; vol. 18; No. 3; Aug. 1975; pp. 749-750.
R. T. Adsmond & H. P. Byrnes, "Pin Sensor for Parts Identification", IBM Tech. Discl. Bul., vol. 13, No. 9, Feb. 1971, p. 2619.
A. W. Till, "Column Contact Probe", IBM Tech. Discl. Bul., vol. 12, No. 4, Sep. 1969, p. 551.
DIT-MCO International Corp. of Kansas City, MO on the SAF-1 Substrate Test Access Fixture.

Primary Examiner—Ernest F. Karlsen
Attorney, Agent, or Firm—Robert B. Levy

[57] ABSTRACT

A high frequency test fixture (40) comprises an array of Euler column probes (57,58,59) positioned between a circuit board or substrate under test (41) and a routing board or substrate (42) connected to an electronic tester. The Euler column probes are held in a compliant conducting medium (53) interposed between the circuit under test and the routing board. Electrical insulation (67,68) is placed around each alternate probe of the array of probes to isolate it from the compliant conducting medium. Such an alternate probe is to be used as a test signal driving probe. The probes adjacent to and surrounding a test signal driving probe are in electrical contact with the compliant medium and are to be used as ground probes. A high frequency test signal applied to the circuit under test via one of the alternate probes follows a return current path along the outside perimeter of the compliant medium thereby substantially reducing noise and effective lead inductance of the test fixture (FIG. 2).

2 Claims, 2 Drawing Sheets

HIGH FREQUENCY IN-CIRCUIT TEST FIXTURE

This application is a continuation of application Ser. No. 749,138, filed June 27, 1985, now abandoned, which is a continuation-in-part of application Ser. No. 618,804, filed June 8, 1984, now abandoned.

TECHNICAL FIELD

The present invention relates to test fixtures for testing electrical circuits, and more particularly, to high frequency in-circuit test fixtures.

BACKGROUND OF THE INVENTION

In the field of electronic testing and diagnosis of defects in circuit boards, it is necessary to effect electronic probe contact with components on the circuit board under test. One type of known testing technique makes use of the so-called "bed of nails" test fixture wherein an array of contact pins mounted through a perforated platform is arranged to contact a plated side of the circuit board. As shown, for example, in the German Offenlegunsschrift 2051052, an array of double-ended spring-loaded pins is positioned between the plated side of a board under test and a plurality of electrically conducting leads coupling the pins to an electronic test equipment.

One known alternative to the above-mentioned spring-loaded pins is an array of Euler column bending beam probes capable of exerting uniform contact pressure on the plated side of the board under test. A commerically available DC mode test fixture sold by the DIT-MCO International Corporation of Kansas City, Mo., makes use of a plurality of Euler column probes, each probe being electrically insulated from all others. However, as the operating speed of logic components increases, electronic testers must have the capability of testing circuit boards at higher frequencies.

The proper design of a high frequency test fixture which provides the interface between an electronic tester and a circuit board becomes critical to achieve reliable test results. Traditional test fixtures using straight or twisted pair wires connecting a bed of nails to the electronic test equipment may generate crosstalk, ground noise and ringing effects. These deleterious effects are most prevalent at high frequencies. Furthermore, the effective lead inductance associated with the wiring can become problematic during in-circuit testing. Using double-ended spring-loaded backdriving and ground pins in combination with a stripline board does not, of itself, reduce the inductance of the circuit formed by the pins and the boards.

My U.S. Pat. No. 4,574,236, issued on Mar. 4, 1986, entitled "High Frequency Test Fixture" and assigned to the assignee herein, discloses a high frequency test fixture which comprises a support body having first and second substantially parallel major surfaces and a double-ended probe held by the support body between the first and second major surfaces thereof. A first probing element is located on the first major surface of the support body and positioned proximate to one end of the double-ended probe. A second probing element is located on the second major surface of the support body and positioned proximate to the other end of the double-ended probe. In order to substantially reduce noise and decrease the effective lead inductance of the test fixture, a transmission loop is formed in the support body between the first and the second probing element. This test fixture clearly overcomes the above-mentioned high frequencies deleterious effects. Although such a fixture operates satisfactorily for its intended purpose, there still exists a need for a high frequency test fixture capable of achieving high test densities on circuit boards and semiconductor integrated circuits.

SUMMARY OF THE INVENTION

The foregoing need is met in an embodiment of the invention wherein a high frequency test fixture comprises a support body including an electrically conducting compliant medium having first and second substantially parallel major surfaces; and a plurality of bendable elongated test probes held by the support body and extending between and projecting from the first and second major surfaces thereof, whereby each probe is surrounded by the compliant medium.

In accordance with one embodiment of the invention, the test probes are Euler column probes and the compliant conducting medium is selected from the group consisting of liquids, viscous materials, gels, rubber and other polymers.

In a preferred embodiment of the invention, the high frequency test fixture comprises a support body including an electrically conducting compliant medium having first and second substantially parallel major surfaces; a first array of a plurality of bendable Euler column probes held by the support body and extending between said first and second major surfaces thereof, each probe of the first array of probes being electrically insulated from the compliant medium; and a second array of a plurality of bendable Euler column probes held by the support body and extending between the first and second major surfaces thereof, each probe of the second array being positioned between two adjacent probes of the first array and being in electrical contact with the compliant medium.

DETAILED DESCRIPTION

Figure 1:
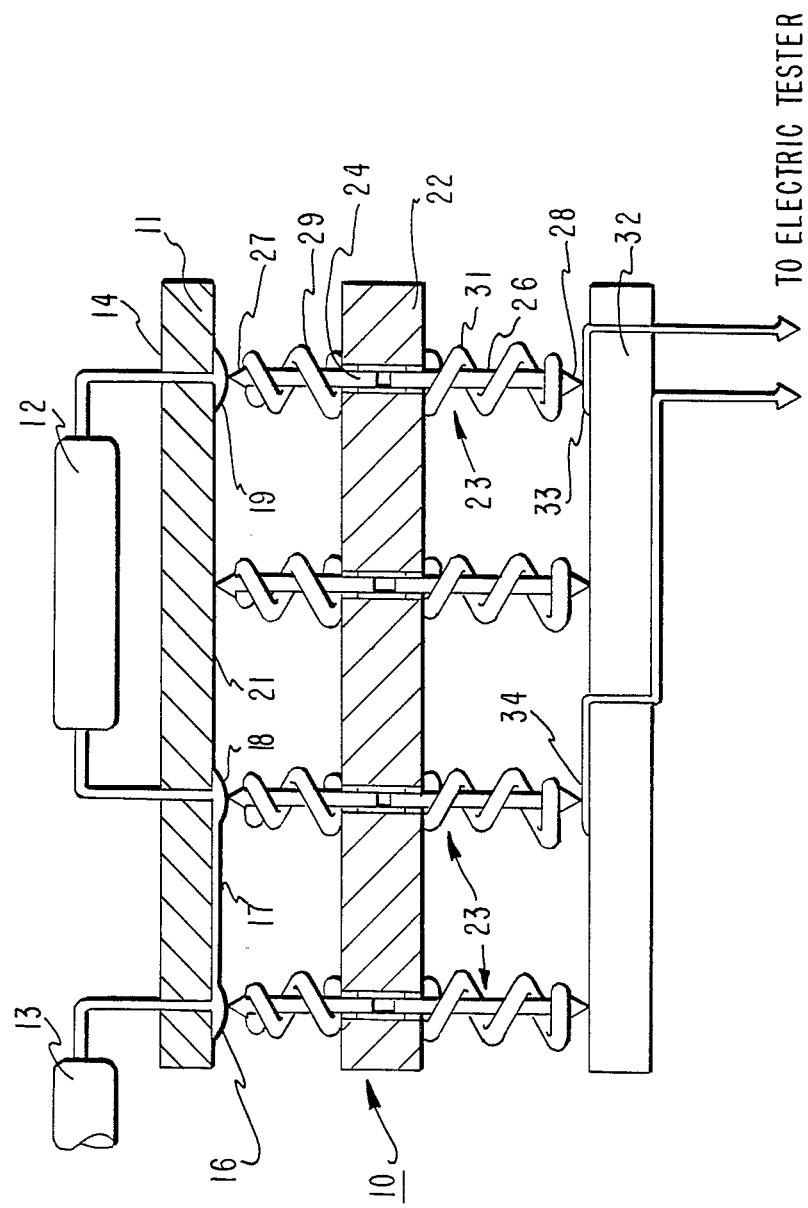
FIG. 1 schematically illustrates a known bed of nails test fixture.

Shown in FIG. 1 is a known test fixture 10 (see e.g., German Offenlegungsschrift 2051052) for testing a circuit board 11 having a plurality of electrical components 12,13 mounted on the components side 14 thereof. Electrical contacts and connections 16, 17, 18 and 19 to the components 12 and 13 are made on the plated side 21 of the circuit board 11. The test fixture 10 comprises a plate 22 made of insulating material, and an array of double-ended spring-loaded pins 23 mounted through the plate 22 and extending on both sides away therefrom. As illustratively shown, each double-ended pin 23 comprises two electrically coupled stems 24 and 26, positioned in axial alignment with each other, and two pointed tips 27 and 28 respectively located at one end of the stems 24 and 26.

As shown, two springs 29 and 31, respectively located around the stems 24 and 26, are positioned between the plate 22 and the pointed tips 27 and 28. One set of pointed tips (e.g., 27) of the array of double-ended pins 23 is adapted to physically contact the electrical terminations and contacts 16 to 19 of the circuit board 11 on the plate side 21 thereof. The other set of pointed tips (e.g., 28) of the array of double-ended pins 23 is adapted to physically contact a connecting board 32 having a plurality of electrically conducting paths 33 and 34 on the surface thereof. The conducting paths 33 and 34 are connected to an electronic tester (not shown) thereby enabling the testing of the electrical component 12 of the circuit board 11.

Figure 2:
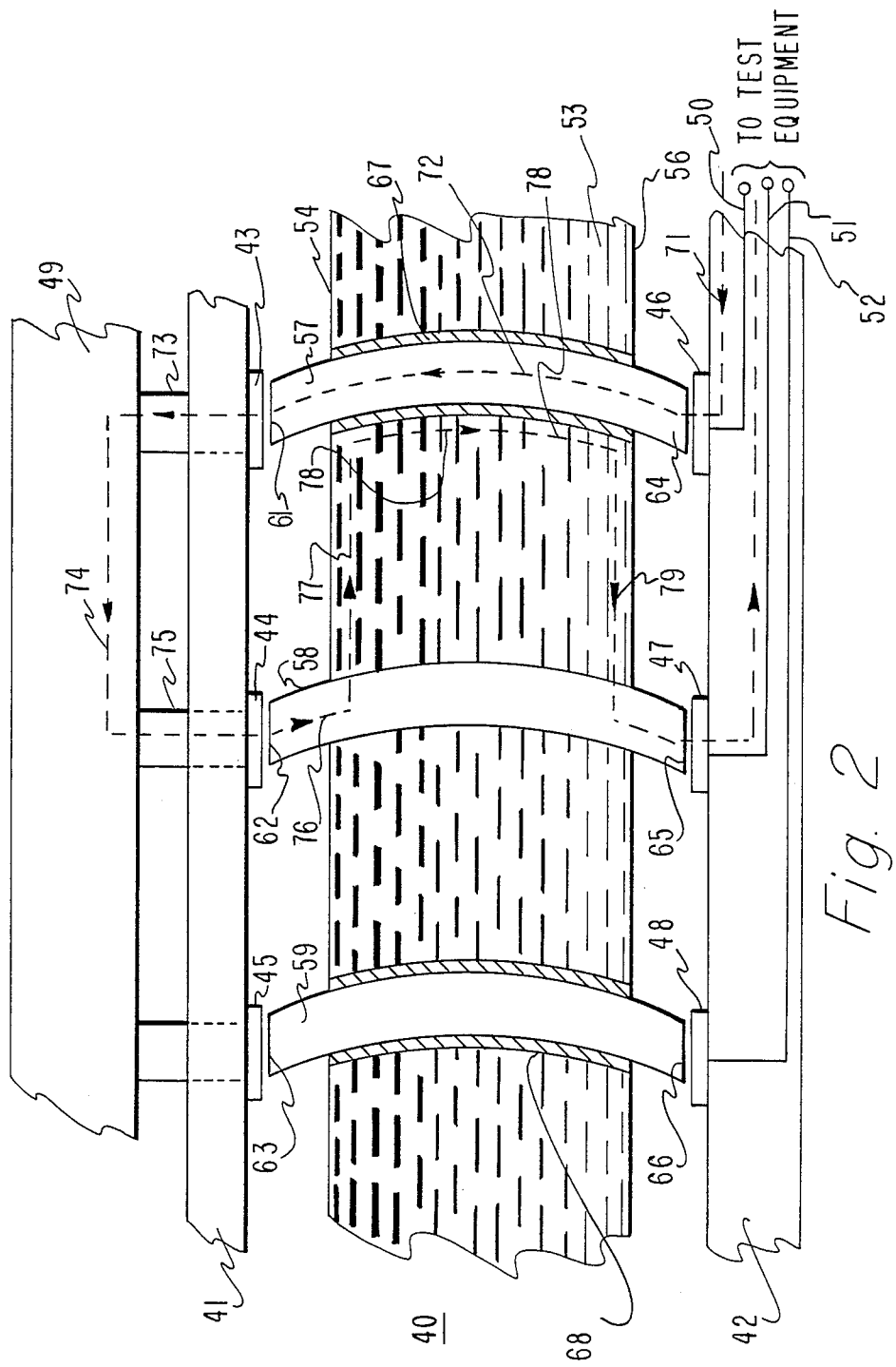
FIG. 2 shows a portion of a test fixture in accordance with an embodiment of the present invention.

Referring now to FIG. 2 wherein, for purpose of illustration only, a cross-sectional view of a small portion of a test fixture 40 in accordance with one embodiment of the invention is shown at a substantially enlarged scale. Typically, the test fixture 40 would be interposed between a circuit 41 to be tested and a connecting board 42 coupled to an electronic test equipment (not shown). The circuit 41 may be a portion of a circuit board (e.g., a printed wiring board), a semiconductor integrated circuit, or a semiconductor wafer. As shown in FIG. 2, the test fixture 40 is used as an electrical interface to establish electrical connections between test points (e.g., 43, 44 and 45) of the circuit 41 under test and electrical terminations (e.g., 46, 47 and 48) of the connecting board 42. The test points 43-45 correspond to electrical contacts of a component 49 on the circuit 41, and the terminations 46, 47 and 48 are connected to a test equipment (not shown) as schematically illustrated by lines 50, 51 and 52, respectively.

The test fixture 40 comprises a support body 53 having a pair of substantially parallel major surfaces 54 and 56. The support body 53, which is positioned between the circuit under test 41 and the connecting board 42, is preferably a planar body having dimensions of its two major surfaces 54 and 56 comparable to or larger than those of the circuit 41 and the board 42.

The support body 53 comprises an array of test probes extending between and projecting from its two major surfaces 54 and 56. For purpose of illustration only and in order to better understand the teachings of the present invention, only three probes 57, 58 and 59 of the array of probes is shown in FIG. 2. As described in my above-mentioned U.S. Pat. No. 4,574,236, which is incorporated herein by reference the support body 53 is adapted to receive and hold therein the test probes 57–59, which probes 57–59 are of a double-ended electrically conducting type. In accordance with an embodiment of the invention, the support body 53 is made of an electrically conducting compliant material and the double-ended probes 57–59 can be bent when subjected to an axial force as illustrated in FIG. 2.

Each one of the double-ended probes 57, 58, 59 includes an elongated bendable cylindrical member having one end 61, 62, 63 adapted to contact the test points 43, 44, 45, respectively, of the circuit 41. The other end 64, 65, 66 of the probes 57, 58, 59 is adapted to contact the electrical terminations 46, 47, 48, respectively, of the connecting board 42. The double-ended probes 57–59 may be made of metal, or of an alloy, or of electrically conducting metal-filled polymer materials, or of any other conducting material. Also, each alternate probe of the array, such as probe 58 for example, is in electrical contact with the support body 53 while the other two probes 57 and 59 adjacent thereto are electrically insulated from the support body 53. Such electrical insulation is achieved by means of insulating elements 67 and 68 located around the probes 57 and 59, respectively. In a preferred embodiment of the invention, the bendable elongated test probes 57 and 59 are insulated Euler columns bending beam probes and the bendable elongated test probe 58 is of the non-insulated Euler column type. These probes are based on the principle formulated by Euler, namely that if a rod is bent the restoring force reaches a maturation level, and that if the rod is not bent too sharply it will return to its original position when released.

The just-described Euler column probes 57, 58 and 59 are located in the electrically conducting compliant support body 53 such that each probe is completely surrounded by a portion of the compliant support body 53. In accordance with the present teachings, the body 53 may be selected from electrically conducting liquids, or viscous conducting materials (e.g., conducting gels), or electrically conducting resilient materials (e.g., rubber-like substances). If conducting liquids or conducting gels are selected as the compliant support body 53, they must be confined in a sealed cavity (not shown). Such a sealed cavity would preferably be of a rubber-type bladder capable of sealing the liquid or gel therein and still allowing a vertical or longitudinal movement of the Euler columns.

Various structural and operational details of the test fixture 40 are described hereafter in connection with a test operation of the circuit 41. If the component 49 on the circuit 41 is to be tested, an electrical test signal is injected from the test equipment (not shown) into line 50. Such a signal, schematically illustrated by the broken arrow line 71 propagates along line 50 and reaches the termination 46. Since the double-ended probe 57 contacts the termination 46, the electrical signal is coupled to the probe 57 and propagates along its longitudinal direction without coupling into the support body 53 due to the insulating element 67. The signal path in the probe 57 is illustrated by a broken arrow line 72. The electrical signal is next coupled to the test point 43 and is fed into the component under test 49 via its terminal lead 73. The signal which propagates along a path 74 in the component 49 is then coupled, via a return terminal lead 75 of the component, to the test point 44. The electrical signal enters the probe 58 at its end portion 62, propagates in the probe 58 as shown by 76, couples into the support body 53 along its periphery as shown by broken lines 77, 78 and 79, and returns back to the test equipment via the probe 58, the termination 47 and the line 51.

As explained in my above-referenced copending patent application, the propagation of the electrical test signal in the conductive support body 53 is confined to a region proximate to the outer surfaces thereof. Maxwell's equations applied to the study of fields propagation and penetration into a conductor show that the magnitudes of the fields and current decrease exponentially with penetration into the conductor. Details of such phenomena are given, for example, in Section 4.12 entitled "Application of Maxwell's Equations; Penetration of Electromagnetic Fields into a Good Conductor" of a book by S. Ramo et al. "Fields and Waves in Communication Electronics", published by John Wiley, 1967, pages 249–254. A quantity often called depth of penetration or skin depth $\delta$, is the depth at which the fields and current decrease to $1/e$ (i.e., 37%) of their values at the surface of the conductor. The equation of the skin depth, $\delta$, is given by Ramo et al. at page 252 of their publication as:

$$\delta = \frac{1}{\sqrt{\pi f \mu \sigma}} \text{ meters} \quad (1)$$

wherein f is the frequency of the signal in Hz;

μ is the permeability of the conducting material in henry/meters; and

σ is the electrical conductivity of the material in mhos/meter.

With the Euler column probe 58 in electrical contact with the compliant support body 53, the applied high frequency electrical test current is forced to follow in the body 53 an electrically conductive transmission loop comprising lines 77, 78 and 79 rather than penetrate across and through the bulk of the probe 58. The propagation of the current along lines 77, 78 and 79 is primarily confined within a depth, δ, of the support body 53 given by the above equation (1).

In accordance with an embodiment of the present invention, rather than having one continuous return ground path extending through the support body 53 (as is well known in priot art test fixtures), the electrical connection of the probe 58 with its surrounding support body portion contributes to a substantial reduction of the inductance of the circuit formed between the contact terminations 46 and 47. Such reduction in the inductance of the test loop enables a substantially increased testing speed using test signals at frequencies substantially larger than those of conventional testing techniques while at the same time achieving substantially higher test densities on much smaller electrical circuits and wafer scale devices and circuits.

It is to be understood that the above-described embodiment is simply illustrative of the principles of the invention. Various other modifications and changes may be devised by those skilled in the art which will embody the principles of the invention and fall within the spirit and scope thereof.

What is claimed is:

1. A test fixture comprising:
   electrically conductive, elastomeric support body means for carrying electrical signals therethough;
   at least one first bendable Euler column held by said support body means so as to extend through and project in opposite directions beyond, said support body means, said first probe being electrically insulated from said support body means; and
   at least one second bendable Euler probe held by, and extending though, said support body means so as to project in opposite directions therebeyond, said second Euler probe being positioned adjacent to said first probe and being in electrical contact with said support body means so that a signal launched into said second Euler probe can pass therefrom into said support body means and travel therethrough before re-entering said second Euler probe.

2. A high frequency test fixture comprising:
   a slab of an electrically conductive elastomer having a uniformly high conductivity throughout its cross section;
   a double-ended bendable Euler column driving probe held by, and extending through the support body but electrically insulated therefrom; and
   a double-ended bendable Euler column ground probe held by, and extending through the support body so as to be in electrical contact therewith, said ground probe being positioned adjacent to said driving probe.

* * * * *